United States Patent
Saab et al.

(10) Patent No.: US 10,561,049 B2
(45) Date of Patent: Feb. 11, 2020

(54) INTERFERENCE FILTER FOR WIRELESS POWER TRANSFER SYSTEMS

(71) Applicant: Integrated Device Technology, Inc., San Jose, CA (US)

(72) Inventors: Alfredo Saab, Sunnyvale, CA (US); David Wilson, Soquel, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 117 days.

(21) Appl. No.: 15/793,797

(22) Filed: Oct. 25, 2017

(65) Prior Publication Data

US 2018/0124959 A1  May 3, 2018

Related U.S. Application Data

(60) Provisional application No. 62/414,575, filed on Oct. 28, 2016.

(51) Int. Cl.
*H05K 9/00* (2006.01)
*H04B 5/00* (2006.01)

(52) U.S. Cl.
CPC ......... *H05K 9/0088* (2013.01); *H04B 5/0037* (2013.01); *H04B 5/0075* (2013.01)

(58) Field of Classification Search
CPC ... H04B 5/0037; H04B 5/0075; H05K 9/0088
See application file for complete search history.

(56) References Cited

U.S. PATENT DOCUMENTS

| | | | |
|---|---|---|---|
| 9,994,112 B2 * | 6/2018 | Tokura | H01F 38/14 |
| 2012/0193996 A1 | 8/2012 | Ryu et al. | |
| 2013/0181535 A1 * | 7/2013 | Muratov | H01F 38/14 |
| | | | 307/104 |
| 2016/0057900 A1 | 2/2016 | Polak et al. | |
| 2016/0231364 A1 * | 8/2016 | Nejatali | G01R 19/0092 |
| 2016/0284465 A1 * | 9/2016 | Maniktala | H01F 38/14 |

OTHER PUBLICATIONS

International Search Report for PCT Application No. PCT/US2017/058576 Issued by the U.S. International Searching Authority on Feb. 22, 2018; pp. 1-4.
Written Opinion of the International Searching Authority for PCT Application No. PCT/US2017/058576 Issued by the U.S. International Searching Authority on Feb. 22, 2018; pp. 1-5.

* cited by examiner

*Primary Examiner* — Jared Fureman
*Assistant Examiner* — Duc M Pham
(74) *Attorney, Agent, or Firm* — Haynes and Boone, LLP

(57) ABSTRACT

An EMI shield for a wireless power transmitter is presented. The EMI shield includes a patterned metallic layer that when positioned over a transmitting coil of the wireless power transmitter capacitively couples to the transmitting coil to capture electromagnetic radiation while allowing magnetic power to pass. In some embodiments, the patterned metallic layer may be a comb filter.

20 Claims, 5 Drawing Sheets

INTERFERENCE FILTER FOR WIRELESS POWER TRANSFER SYSTEMS

RELATED APPLICATIONS

This application incorporates by reference for all purposes U.S. Provisional Patent Application No. 62/414,575, entitled "INTERFERENCE FILTER FOR WIRELESS POWER TRANSFER SYSTEMS" filed on Oct. 28, 2016.

TECHNICAL FIELD

Embodiments of the present invention are related to wireless power systems and, specifically, to reduction of electric and/or electromagnetic interference in wireless power or other types of systems that use coils for transfer of energy and/or information.

DISCUSSION OF RELATED ART

Typically, a wireless power system includes a transmitter coil that is driven to produce a time-varying magnetic field and a receiver coil that is positioned relative to the transmitter coil to receive the power transmitted in the time-varying magnetic field.

One issue that arises with wireless power transmission is the production of electric and/or electromagnetic interference (EMI) at the operating frequency of the power transmitter as well as from various harmonic and inharmonic artifact frequencies of transmitter operation. This can include unrelated frequencies from other system components such as a microcontroller that could radiate via the power delivery coil.

Therefore, there is a need to develop systems that reduce the EMI.

SUMMARY

In accordance with some embodiments of the present invention, an EMI shield for a wireless power transmitter includes a patterned metallic layer (or layers) that when positioned over a transmitting coil of the wireless power transmitter capacitively couples to the transmitting coil to block, impede, and/or absorb interference radiation while allowing magnetic flux to pass. In some embodiments, the patterned metallic layer (or layers) may be a comb filter.

These and other embodiments are further discussed below with respect to the following figures.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention.

Elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

The figures are illustrative only and relative sizes of elements in the figures have no significance. For example, although in FIG. 2 receiver coil 108 is illustrated as smaller than transmitter coil 106, receiver coil 108 may be the same size as transmitter coil 106 or may be smaller, or larger depending on particular systems.

Figure 1:
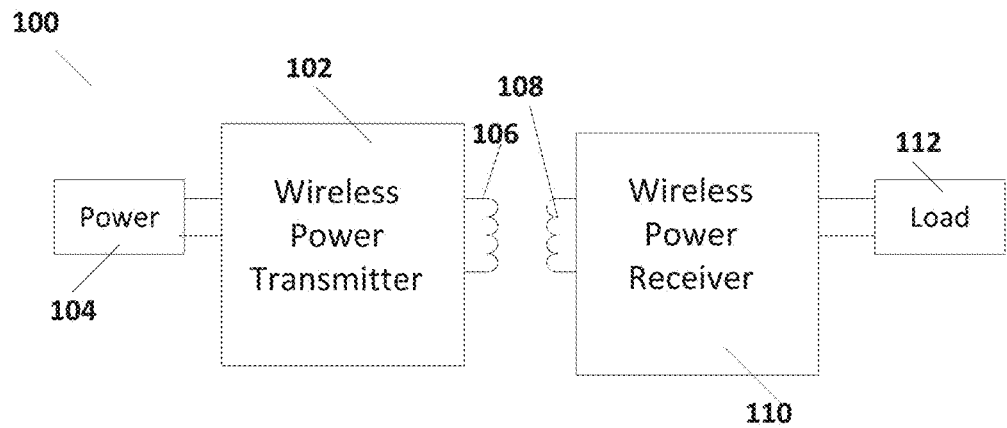
FIG. 1 illustrates a wireless power transmission system.

FIG. 1 illustrates a system 100 for wireless transfer of power. As illustrated in FIG. 1, a wireless power transmitter 102 drives a coil 106 to produce a magnetic field. A power supply 104 provides power to wireless power transmitter 102. Power supply 104 can be, for example, a battery based supply or may be powered by alternating current, for example 120V at 60 Hz. Wireless power transmitter 102 drives coil 106 at a range of frequencies, typically according to one of the wireless power standards. However, embodiments of the present invention could be applicable to any system where it is practical to transfer power and/or information by means of magnetic coils irrespective of any standard that may exist.

There are multiple standards for wireless transmission of power, including the Alliance for Wireless Power (A4WP) standard and the Wireless Power Consortium standard, the Qi Standard. Under the A4WP standard, for example, up to 50 watts of power can be inductively transmitted to multiple charging devices in the vicinity of coil 106 at a power transmission frequency of around 6.78 MHz. Under the Wireless Power Consortium, the Qi specification, a resonant inductive coupling system is utilized to charge a single device at the resonance frequency of the device. In the Qi standard, coil 108 is placed in close proximity with coil 106 while in the A4WP standard, coil 108 is placed near coil 106 along with other coils that belong to other charging devices. FIG. 1 depicts a generalized wireless power system 100 that operates under any of these standards.

As is further illustrated in FIG. 1, the magnetic field produced by coil 106 induces a current in coil 108, which results in power being received in a receiver 110. Receiver 110 receives the power from coil 108 and provides power to a load 112, which may be a battery charger and/or other components of a mobile device. Receiver 110 typically includes rectification to convert the received AC power to DC power for load 112.

In some embodiments, during wireless power transfer when the upper operating frequency limit is reached and duty cycle power limiting method is employed, Conducted and Radiated Emissions have been observed. It has been found that the primary cause of the conducted emission is common mode voltage changes on the surface of the TX coil and the power receiving device, which form opposite plates of a parasitic capacitance. The inherent capacitance of the charging device to Earth's surface forms a current path that is causing current flow that is capacitively coupled (via a time-varying electric fields—E-fields) from the Tx coil to the charging device to the Earth ground (Earth), which can be detected by an EMI measurement unit.

Figure 2:
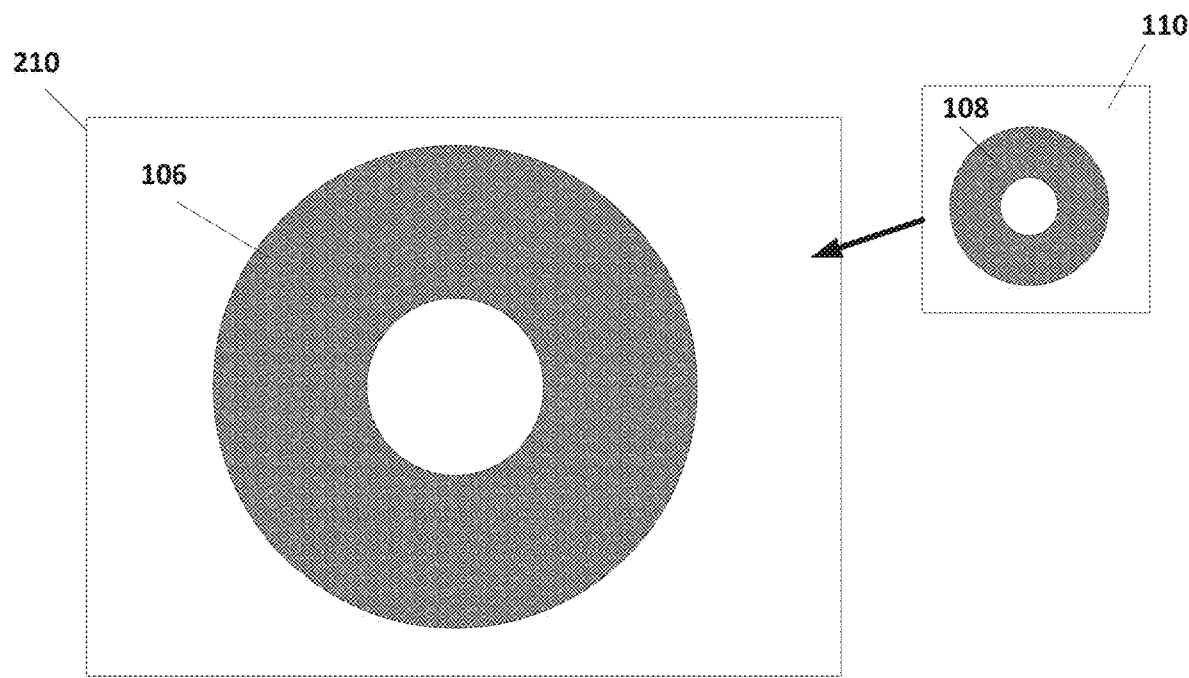
FIG. 2 illustrates the transmitter coil positioned on a printed circuit board of a transmitter.

Embodiments of the present invention create a shield, for example a patterned metallic shield, on the power delivery coil in order to reduce EMI. In particular, the shield uses topological techniques that minimize the impact on the power delivery magnetic fields while maximally attenuating electric and/or electromagnetic emissions. The core concepts leverage firstly that the propagation of magnetic fields is quite different from the propagation of electromagnetic fields, and further, can make use of the fact that the wavelength of the magnetic field in some cases is substantially longer than that of the electromagnetic waves of concern for reduction of EMI. Consequently, a shield can be formed by patterning a conductive material in such a fashion as to direct electric fields, which are capacitively coupled between the transmitter coil and the conductive material, to the transmitter ground while allowing substantially all of the magnetic field to pass. In some cases, the patterning can include a decorative or design component. In any case, the patterning, although allowing for capacitive coupling of electric fields between the transmitter coil and the conductive material FIG. 2 illustrates an example of a transmission coil 106 mounted in a pad 210. In some embodiments, transmission coil 106 is mounted on a printed circuit board (PCB), which is not illustrated in FIG. 2. FIG. 2 additionally illustrates a receiver coil 108 mounted in a receiving device 110 being brought into proximity to transmission coil 106. As discussed above, embodiments of the present invention reduce or substantially eliminate the capacitive coupling of the electromagnetic fields between transmission coil 106 and receiving device 110, thereby reducing EMI, while not substantially interfering with the magnetic transmission of wireless power between transmission coil 106 and receiver coil 108.

Figure 3:
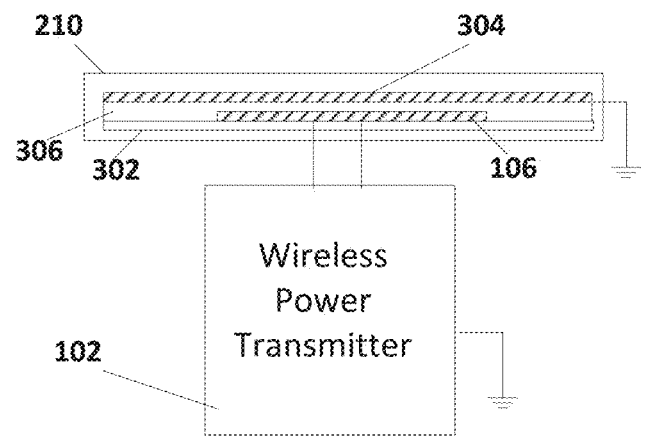
FIG. 3 illustrates an example embodiment of a transmission system according to the present invention.

FIG. 3 illustrates a wireless transmitter according to some embodiments of the present invention. As shown in FIG. 3, transmission coil 106 is embedded in a pad 210. In some embodiments, transmission coil 106 can be mounted on a printed circuit board (PCB) 302. In accordance with some embodiments of the present invention, an EMI shield 304 is mounted over transmission coil 106 and in some cases may be separated from transmission coil 106 by an insulation or spacer layer 306 on PCT 302. In some embodiments, EMI shield 304 can be coupled to the ground of wireless power transmitter 102, as is illustrated in FIG. 3. In some embodiments, EMI shield 304 may include multiple patterned metallic layers that block electromagnetic radiation that causes EMI while being transparent to the magnetic wireless power transmission.

Figure 4A:
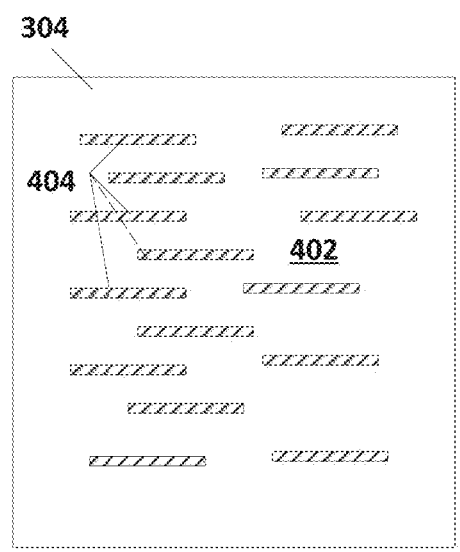
FIGS. 4A, 4B, and 4C illustrate some example embodiments of shields.

FIG. 4A illustrates a planar view of EMI shield 304. EMI shield 304, in the embodiment illustrated in FIG. 4A, is a metallic sheet 402 with a hole pattern 404. The metallic sheet 402 can be patterned in such a way that it appears as a solid or nearly solid barrier to the electromagnetic energy from transmission coil 106, but is configured in a way such that the power robbing inductive loop currents (e.g. eddy currents) are small to negligible. Most simply, in a 2-D implementation as illustrated in FIG. 4A, the metal hole patterns 404 provide small gaps between areas of metal in metal sheet 402 that minimize eddy currents. The variety of patterns that could be effective are endless, but likely there may be preferred patterns that are more effective at blocking the capacitively coupled electromagnetic energy while not interfering substantially with the magnetically transmitted wireless power. In some embodiments, the patterning can be, in part, decorative while performing the shielding functions.

Figure 4B:
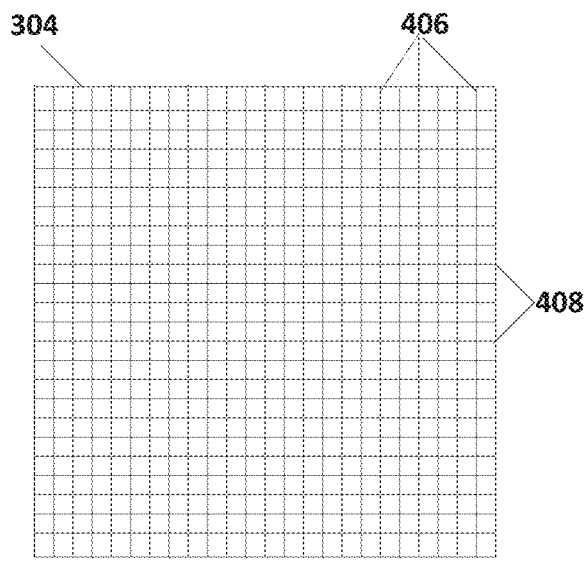

FIG. 4B illustrates another embodiment of EMI shield 304 with an entirely different topological approach to EMI shield shielding. In the example illustrated in FIG. 4B, a continuous metallic grid is formed by crossed horizontal wires 408 and vertical wires 406. Inductive interaction can be minimized simply by managing the horizontal and vertical grid spacing and metallic line width. The new method is topologically entirely different because very specifically the current loops formed by a fully metallic layer are avoided, however inductively coupled currents may be formed in the wires surrounding the interstitial spacings.

Figure 4C:
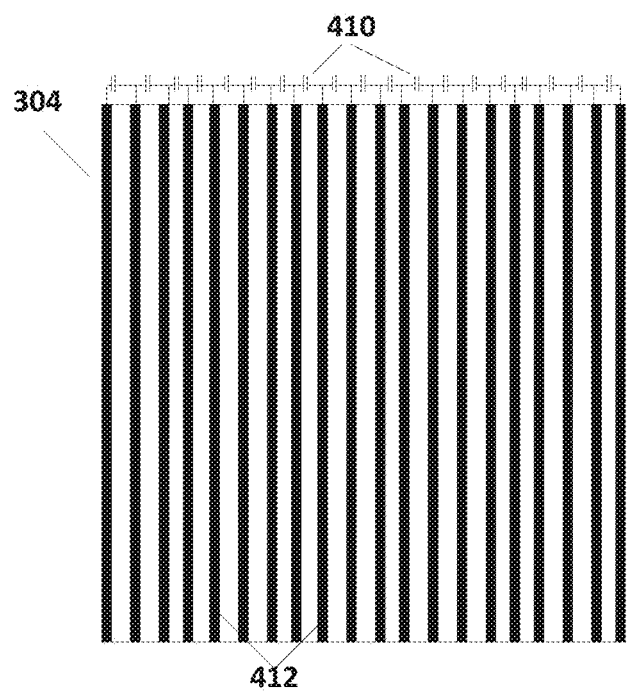

FIG. 4C illustrates another embodiment which beneficial and/or cost effective by running lengths of very thin wire 412, with the ends coupled by high frequency capacitors 410. Such an arrangement would nearly eliminate inductive interactions while capacitors 410 would provide coupling that joins the ends of wires and/or join adjacent wires.

In some embodiments, two or more layers of EMI shield 304 may be overlaid in a way that the overlaid combination further blocks electromagnetic waves. The EMI shield may be enhanced by capacitive coupling between the overlaid EMI shields 304. However, such capacitive coupling between the layers may have a small effect in the operating frequency range of the transmitting coil and may provide further problems with interactions due to magnetic inductive coupling.

EMI shield 304 may be formed on a substrate. In some embodiments, layers utilized to form EMI shields 304 can be formed of thin film metallic materials deposited on a substrate such as plastic films or similar instead of physical wires or PCB traces formed on a substrate such as a PCB. Such techniques could include exceptionally low cost methods such as vapor deposition, silk-screening/printing of conductive inks, and so-on. These materials and their application (pattern, thickness, etc.) can be selected to further enhance electromagnetic control benefits in relation to keeping inductive interactions at a minimum. Electric and/or electromagnetic shields 304 formed in this fashion could be single-sided, double-sided, and/or multi-layered. Costs/value could be further enhanced in the patterning, which could include desirable aesthetic design elements, logos, etc. And with various application techniques, the patterns could be applied directly to already existing surfaces (e.g., to the surface of pad 210), and thereby avoid the costs associated with using plastic films or similar materials. Alternatively, plastic films may be printed and embedded in pad 210 over transmission coil 106 as is illustrated in FIG. 3. In some embodiments, such electric and/or electromagnetic shields 304 may include multiple conductive layers separated by non-conductive or less conductive layers of printed/deposited materials and not sheet material.

Figure 5A:
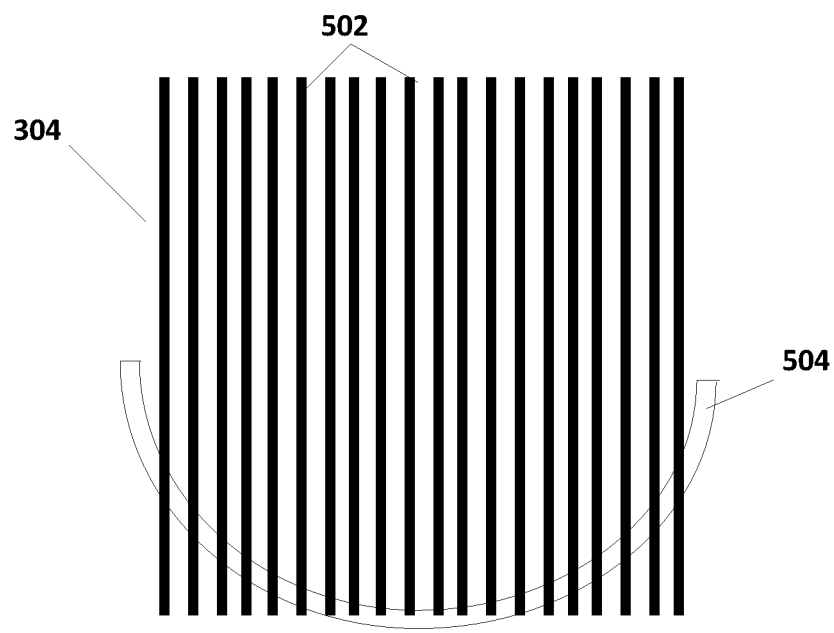
FIGS. 5A, 5B, and 5C illustrate an example comb-filter shield according to some embodiments.
Figure 5B:
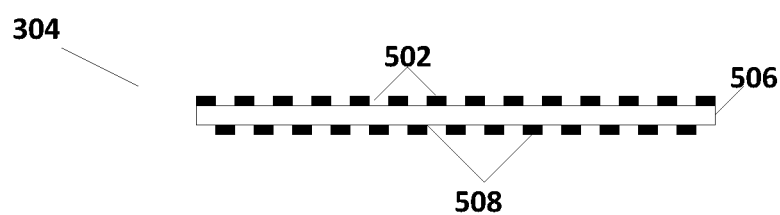

FIGS. 5A and 5B illustrate another embodiment of EMI shield 304, which as discussed above may be formed on a substrate such as a PCB, may be imprinted on a plastic sheet, or in some embodiments may be formed directly on pad 210. FIGS. 5A and 5B illustrate some embodiments where EMI shield 304 is a comb EMI filter. By adding an Electric field collector (Comb EMI filter) between Transmitter coil 106 and the receiving coils 108 of receiving device 110, the capacitive coupled between transmitter coil 106 and receiving device 110 is interrupted and changed to be the capacitive coupling between transmitter coil 106 to the comb filter EMI shield 304.

As is illustrated in FIG. 5A, EMI shield 304 includes multiple open ended lines 502 grounded on one side with a ground strap 504. Ground strap 504 can couple one side of all of the open ended lines 502 to a ground, in particular to the ground of transmitter 102.

Figure 5C:
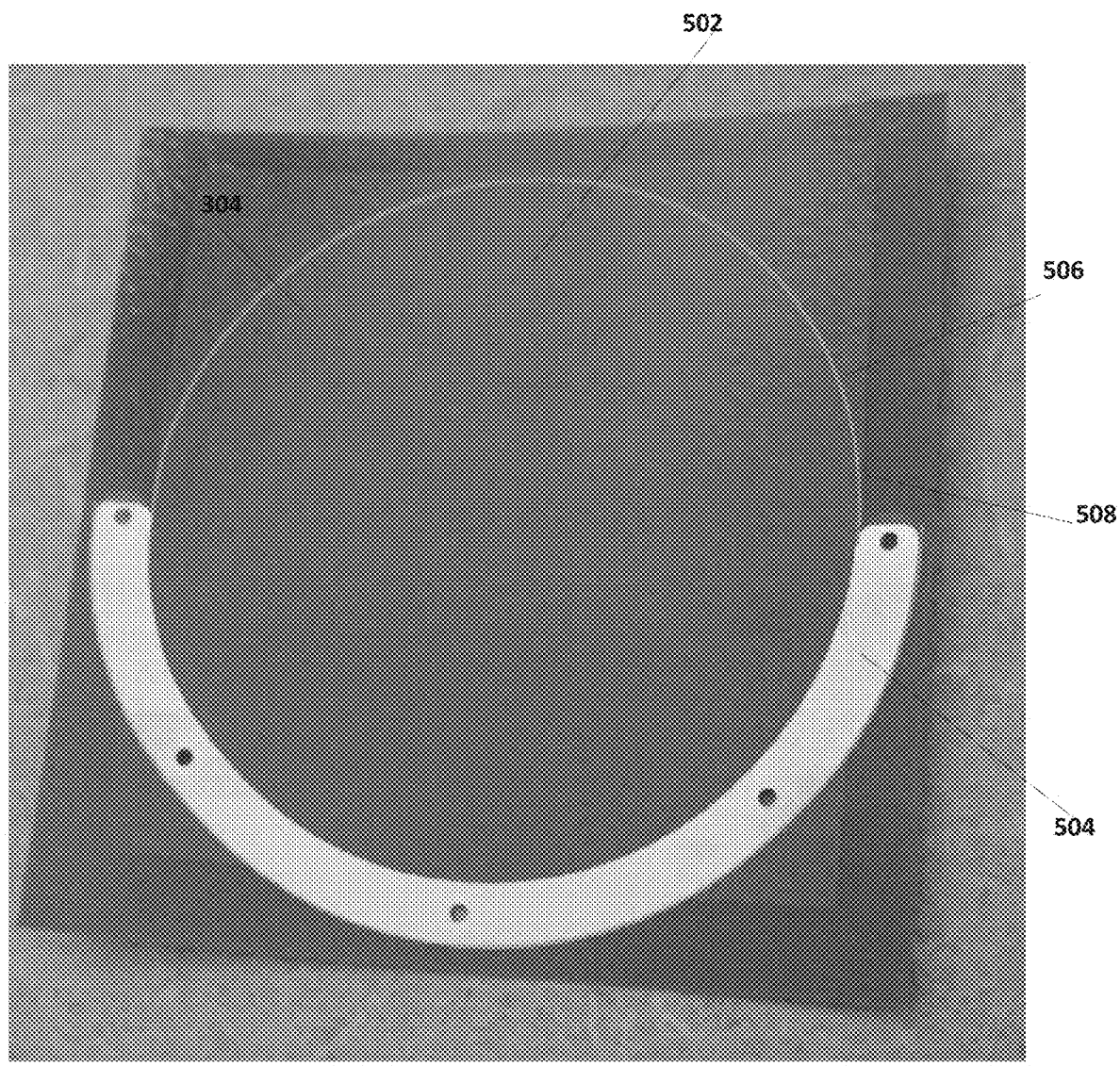

FIG. 5B illustrates a second embodiment which includes further open ended lines 508 separated from open ended lines 502 by an insulating or less conducting material 506. As is illustrated in FIG. 5B, open ended lines 508 are arranged in a non-overlapping fashion with open ended lines 508 to provide EMI shielding of a continuous sheet without allowing for inductive current loops to be formed. Ground strap 504 is configured to couple one end of both open ended lines 502 and open ended lines 508 to ground. FIG. 5C illustrates an example of the embodiment illustrated in FIG. 5B.

Coupling one side of open ended lines 502 or both open ended lines 502 and 508 to the transmitter ground stops the current flow through Earth and consequently through an EMI measurement unit. The comb filter of EMI shield 304 is held at 0V potential and does not change with time, so there is no time-varying E-field created from capacitive coupling of transmitter 102 to receiving device 110 with the comb filter of EMI shield 304 placed directly above transmitter coil 106, and all the current that still exists in the E-field is 'caught' by the comb filter of EMI shield 304 and returned to the local transmitter ground, and thus does not flow in through the EMI test equipment which results in a large reduction in Conducted Emissions (CE). Interaction with magnetic flux is minimized owing to the elimination of loops that allow circulating eddy currents.

In some embodiments as illustrated in FIGS. 5A, 5B, and 5C, the open ended traces 502 and 508 can be formed of thin traces of width less than 3 mm. Additionally, as is illustrated in FIG. 5B, open ended traces 502 may be positioned such that there is overlap and the entire space above transmitter coil 106 is metallic, while open ended traces 502 and 508 do not substantially overlap each other.

The above detailed description is provided to illustrate specific embodiments of the present invention and is not intended to be limiting. Numerous variations and modifications within the scope of the present invention are possible. The present invention is set forth in the following claims.

What is claimed is:

1. An EMI shield for a wireless power transmitter, comprising:
a shield layer that, when positioned over a transmitting coil of the wireless power transmitter, capacitively couples to the transmitting coil to capture electromagnetic radiation while allowing magnetic power to pass, wherein the shield layer is a patterned metallic layer formed on a substrate, the patterned metallic layer having a plurality of holes formed in a metallic layer, the metallic layer being coupled to ground.

2. The EMI shield of claim 1, wherein the patterned metallic layer is a grid of overlapping wires that are connected at their intersections.

3. The EMI shield of claim 1, wherein another end opposite the one end that is grounded of each of the first open end traces are coupled by capacitors.

4. The EMI shield of claim 1, wherein the plurality of holes of the patterned metallic layer includes a hole pattern positioned such as to not support eddy currents formed by the magnetic power.

5. The EMI shield of claim 4, wherein the hole pattern forms a decorative pattern.

6. An EMI shield for a wireless power transmitter, comprising:
a shield layer that, when positioned over a transmitting coil of the wireless power transmitter, capacitively couples to the transmitting coil to capture electromagnetic radiation while allowing magnetic power to pass, wherein the shield layer is a patterned metallic layer formed on a substrate, the patterned metallic layer having open ended traces formed in the patterned metallic layer, and
wherein the patterned metallic layer includes a plurality of first open ended traces grounded with a ground strap clamped across the plurality of first open ended traces and configured to ground one end of each of the first open ended traces.

7. The EMI shield of claim 6, further including a plurality of second open ended traces separated from the plurality of first open ended traces in a non-overlapping fashion and wherein the ground strap is configured to ground one end of the second open ended traces.

8. The EMI shield of claim 6, wherein the substrate is a printed circuit board.

9. The EMI shield of claim 6, wherein the substrate is a plastic sheet.

10. A method of providing a shield for a wireless power transmitter, comprising:
covering a wireless power coil with a patterned metallic layer that capacitively couples to the wireless power coil while passing magnetic power from the wireless power coil; and
grounding the patterned metallic layer,
wherein the patterned metallic layer is formed on a substrate, and
wherein the patterned metallic layer has a plurality of holes formed in a metallic layer, the metallic layer being coupled to ground.

11. The method of claim 10, wherein the plurality of holes formed in the patterned metallic layer are positioned such that eddy currents are not formed in the metallic layer by the magnetic power output of the wireless power coil.

12. The method of claim 10, wherein the substrate is a printed circuit board.

13. The method of claim 10 wherein the substrate is a plastic sheet.

14. The method of claim 10 wherein the plurality of holes of the patterned metallic layer includes a hole pattern positioned such as to not support eddy currents formed by the magnetic power.

15. The method of claim 14, wherein the hole pattern forms a decorative pattern.

16. A method of providing a shield for a wireless power transmitter, comprising:
covering a wireless power coil with a patterned metallic layer that capacitively couples to the wireless power coil while passing magnetic power from the wireless power coil; and
grounding the patterned metallic layer,
wherein the patterned metallic layer is formed on a substrate, the patterned metallic layer having open ended traces formed in the patterned metallic layer, and wherein the patterned metallic layer includes a plurality of first open ended traces grounded with a ground strap clamped across the plurality of first open ended traces and configured to ground one end of each of the first open ended traces.

17. The method of claim 16, wherein the patterned conductor includes wire traces positioned on a substrate where the ends of the wired traces are coupled by capacitors.

18. The method of claim 16, wherein the patterned metallic layer further includes a plurality of second open ended traces separated from the plurality of first open ended traces in a non-overlapping fashion and wherein the ground strap is further configured to ground one end of the second open ended traces.

19. The method of claim 16, wherein the substrate is a printed circuit board.

20. The method of claim 16, wherein the substrate is a plastic sheet.

* * * * *